(12) United States Patent
Tomita et al.

(10) Patent No.: US 11,837,668 B2
(45) Date of Patent: Dec. 5, 2023

(54) SEMICONDUCTOR ELEMENT AND SEMICONDUCTOR DEVICE

(71) Applicant: SONY SEMICONDUCTOR SOLUTIONS CORPORATION, Kanagawa (JP)

(72) Inventors: Chihiro Tomita, Kumamoto (JP); Tomohiro Hirai, Kumamoto (JP); Shintaro Okamoto, Kanagawa (JP); Kentaro Eda, Kumamoto (JP); Takashi Watanabe, Kumamoto (JP); Kazuki Yamaguchi, Kumamoto (JP); Norikazu Kasahara, Kumamoto (JP); Kohei Suzuki, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/280,274

(22) PCT Filed: Sep. 30, 2019

(86) PCT No.: PCT/JP2019/038533
§ 371 (c)(1),
(2) Date: Mar. 26, 2021

(87) PCT Pub. No.: WO2020/071320
PCT Pub. Date: Apr. 9, 2020

(65) Prior Publication Data
US 2022/0052208 A1    Feb. 17, 2022

(30) Foreign Application Priority Data
Oct. 4, 2018 (JP) .................... 2018-189230

(51) Int. Cl.
*H01L 29/94* (2006.01)

(52) U.S. Cl.
CPC ................... *H01L 29/945* (2013.01)

(58) Field of Classification Search
None
See application file for complete search history.

(56) References Cited

U.S. PATENT DOCUMENTS 6,306,720 B1 * 10/2001 Ding ............... H01L 29/945
                                                438/386
2005/0067674 A1 * 3/2005 Maget ............ H01L 29/94
                                                257/E29.345

(Continued)

FOREIGN PATENT DOCUMENTS

JP    2008-294039    12/2008
JP    2009-088241    4/2009

(Continued)

OTHER PUBLICATIONS

International Search Report prepared by the Japan Patent Office dated Oct. 11, 2019, for International Application No. PCT/JP2019/038533.

*Primary Examiner* — Khaja Ahmad
(74) *Attorney, Agent, or Firm* — Sheridan Ross PC

(57) ABSTRACT

The capacity of a MOS capacitor is increased. A semiconductor element includes a first semiconductor region, an insulation film, a gate electrode, and a second semiconductor region. The first semiconductor region is arranged on a semiconductor substrate and has a recess on the surface. The insulation film is arranged adjacent to the surface of the first semiconductor region. The gate electrode is arranged adjacent to the insulation film and constitutes a MOS capacitor with the first semiconductor region. The second semiconductor region is arranged adjacent to the first semiconductor region on the semiconductor substrate, formed in the same conductive type as the first semiconductor region, and (Continued)

supplies a carrier to the first semiconductor region when the MOS capacitor is charged and discharged.

7 Claims, 12 Drawing Sheets

(56) References Cited

U.S. PATENT DOCUMENTS

| | | | | |
|---|---|---|---|---|
| 2005/0156218 A1* | 7/2005 | Nirschl | ............. | H01L 29/66181 |
| | | | | 257/E21.396 |
| 2008/0157159 A1* | 7/2008 | Hook | .................... | H01L 29/945 |
| | | | | 257/312 |
| 2009/0200642 A1* | 8/2009 | Mann | ...................... | H01L 29/93 |
| | | | | 257/599 |
| 2009/0321802 A1* | 12/2009 | Choi | ....................... | H01L 29/94 |
| | | | | 257/296 |
| 2010/0044765 A1* | 2/2010 | Kato | ................. | H01L 29/66181 |
| | | | | 257/E29.345 |
| 2010/0091167 A1 | 4/2010 | Azami | | |
| 2013/0161792 A1* | 6/2013 | Tran | ................. | H01L 29/66083 |
| | | | | 438/386 |
| 2019/0067291 A1* | 2/2019 | Marzaki | ............ | H01L 27/10841 |

FOREIGN PATENT DOCUMENTS

| | | |
|---|---|---|
| JP | 2010-050374 | 3/2010 |
| JP | 2010-093641 | 4/2010 |
| JP | 2013021077 A | 1/2013 |
| JP | 2013-161868 | 8/2013 |

* cited by examiner

D

E

F

SEMICONDUCTOR ELEMENT AND SEMICONDUCTOR DEVICE

CROSS REFERENCE TO RELATED APPLICATIONS

This application is a national stage application under 35 U.S.C. 371 and claims the benefit of PCT Application No. PCT/JP2019/038533 having an international filing date of 30 Sep. 2019, which designated the United States, which PCT application claimed the benefit of Japanese Patent Application No. 2018-189230, filed 4 Oct. 2018, the entire disclosures of each of which are incorporated herein by reference.

TECHNICAL FIELD

The present disclosure relates to a semiconductor element and a semiconductor device. More specifically, the present disclosure relates to a semiconductor element including a MOS capacitor and a semiconductor device using the semiconductor element.

BACKGROUND ART

Conventionally, a semiconductor element using, as a capacitor, a MOS capacitor formed on a semiconductor substrate has been used. For example, a MOS capacitor having a structure in which a p+(or n+) type semiconductor region serving as a lower electrode is formed on a surface layer of a well region formed in a p-type and in which an upper electrode is formed on the semiconductor region via a capacitive insulation film is used (see, for example, Patent Document 1).

The above-mentioned MOS capacitor is used as a charge accumulation unit which is arranged in a pixel of an imaging element and holds charges generated on the basis of photoelectric conversion. Specifically, the above-mentioned MOS capacitor temporarily holds charges generated by photoelectric conversion of the light from a subject.

CITATION LIST

Patent Document

Patent Document 1: Japanese Patent Application Laid-Open No. 2013-161868

SUMMARY OF THE INVENTION

Problems to be Solved by the Invention

In the above-mentioned conventional technique, a planar type MOS capacitor, in which the upper electrode and the lower electrode are formed in a flat plate shape, is used. Thus, there is a problem that it is difficult to increase the capacity of the MOS capacitor. That is, there is a problem that the occupied area increases as the capacity of the MOS capacitor increases, thereby making it difficult to increase the capacity per unit area.

The present disclosure has been made in view of the above-mentioned problems, and an object of the present disclosure is to increase the capacity of the MOS capacitor.

Solutions to Problems

The present disclosure has been made to solve the above-mentioned problems, and the first aspect thereof is a semiconductor element including: a first semiconductor region that is arranged on a semiconductor substrate and includes a recess on a surface; an insulation film that is arranged adjacent to the surface of the first semiconductor region; a gate electrode that is arranged adjacent to the insulation film and between which and the first semiconductor region, a MOS capacitor is constituted; and a second semiconductor region that is arranged adjacent to the first semiconductor region on the semiconductor substrate, formed in a same conductive type as the first semiconductor region, and supplies a carrier to the first semiconductor region when the MOS capacitor is charged and discharged.

Furthermore, in this first aspect, the first semiconductor region may include a plurality of the recesses.

Furthermore, in this first aspect, the first semiconductor region may include the recess formed in an opening having a substantially rectangular shape.

Furthermore, in this first aspect, the first semiconductor region may have a short side of the rectangle arranged near a boundary with the second semiconductor region.

Furthermore, in this first aspect, the first semiconductor region may include the recess formed to have a short side having a length smaller than approximately twice a thickness of the gate electrode.

Furthermore, in this first aspect, the first semiconductor region may include an impurity concentration higher than $10^{18}/cm^3$.

Furthermore, the second aspect of the present disclosure is a semiconductor device including: a first semiconductor region that is arranged on a semiconductor substrate and includes a recess on a surface; an insulation film that is arranged adjacent to the surface of the first semiconductor region; a gate electrode that is arranged adjacent to the insulation film and between which and the first semiconductor region, a MOS capacitor is constituted; a second semiconductor region that is arranged adjacent to the first semiconductor region on the semiconductor substrate, formed in a same conductive type as the first semiconductor region, and supplies a carrier to the first semiconductor region when the MOS capacitor is charged and discharged; and an electronic circuit that supplies current for the MOS capacitor to be charged and discharged via the gate electrode and the second semiconductor region.

By adopting such an aspect, the effect is provided in which the first semiconductor region, the insulation film, and the gate electrode are stacked in the region where the recess is formed. Expansion of the first semiconductor region and the interface between the gate electrode and the insulation film due to the recess is assumed.

MODE FOR CARRYING OUT THE INVENTION

Figure 1:
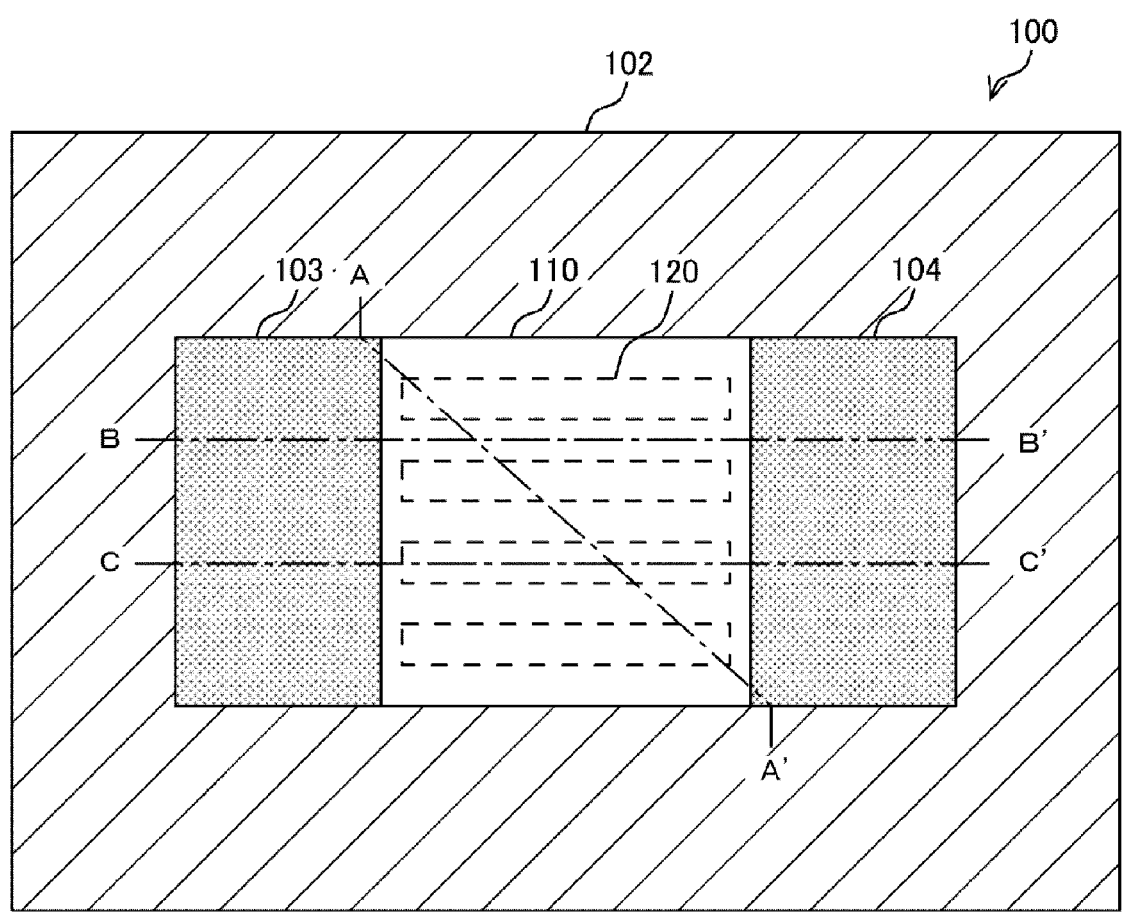
FIG. 1 is a diagram showing a configuration example of a semiconductor element according to a first embodiment of the present disclosure.

Next, modes for carrying out the present disclosure (hereinafter, referred to as embodiments) will be described with reference to the drawings. In the following drawings, the same or similar reference numerals are given to the same or similar parts. However, the drawings are schematic, and the dimensional ratios of the respective parts and the like do not always consistent with the actual ones. Furthermore, it is needless to say that the drawings may include some parts having different dimensional relationships and ratios among the drawings. Also, note that the embodiments will be described in the following order.

1. First embodiment (configuration of the semiconductor element)
2. Second embodiment (method for manufacturing the semiconductor element)
3. Examples of application to the imaging element 1. First Embodiment

[Configuration of the Semiconductor Element]

FIG. 1 is a diagram showing a configuration example of a semiconductor element according to the first embodiment of the present disclosure. The drawing is a plan view showing a configuration example of a MOS capacitor 100. The semiconductor element of the present disclosure will be described by taking the MOS capacitor 100 as an example. Note that the MOS capacitor 100 is an example of the semiconductor element described in the claims.

The MOS capacitor 100 in the drawing is formed on a semiconductor substrate 101 (not shown) and includes a gate electrode 110. The gate electrode 110 is arranged adjacent to a semiconductor region (first semiconductor region 140 described later) formed on the semiconductor substrate 101 via an insulation film, thus constituting a capacitor. Furthermore, in the MOS capacitor 100, similar to a MOS transistor, second semiconductor regions 103 and 104 corresponding to the source and the drain, respectively, are formed. The second semiconductor regions 103 and 104 can be used as wiring (lead wires) for the capacitor. A separation region 102 is arranged around the MOS capacitor 100. Note that the dotted rectangle in the drawing represents a recess 120 arranged in the first semiconductor region 140. The recess 120 in the drawing is formed in a rectangular groove shape, and represents an example in which a plurality of recesses 120 is arranged.

[Configuration of the Cross Section of the MOS Capacitor]

Figure 2:
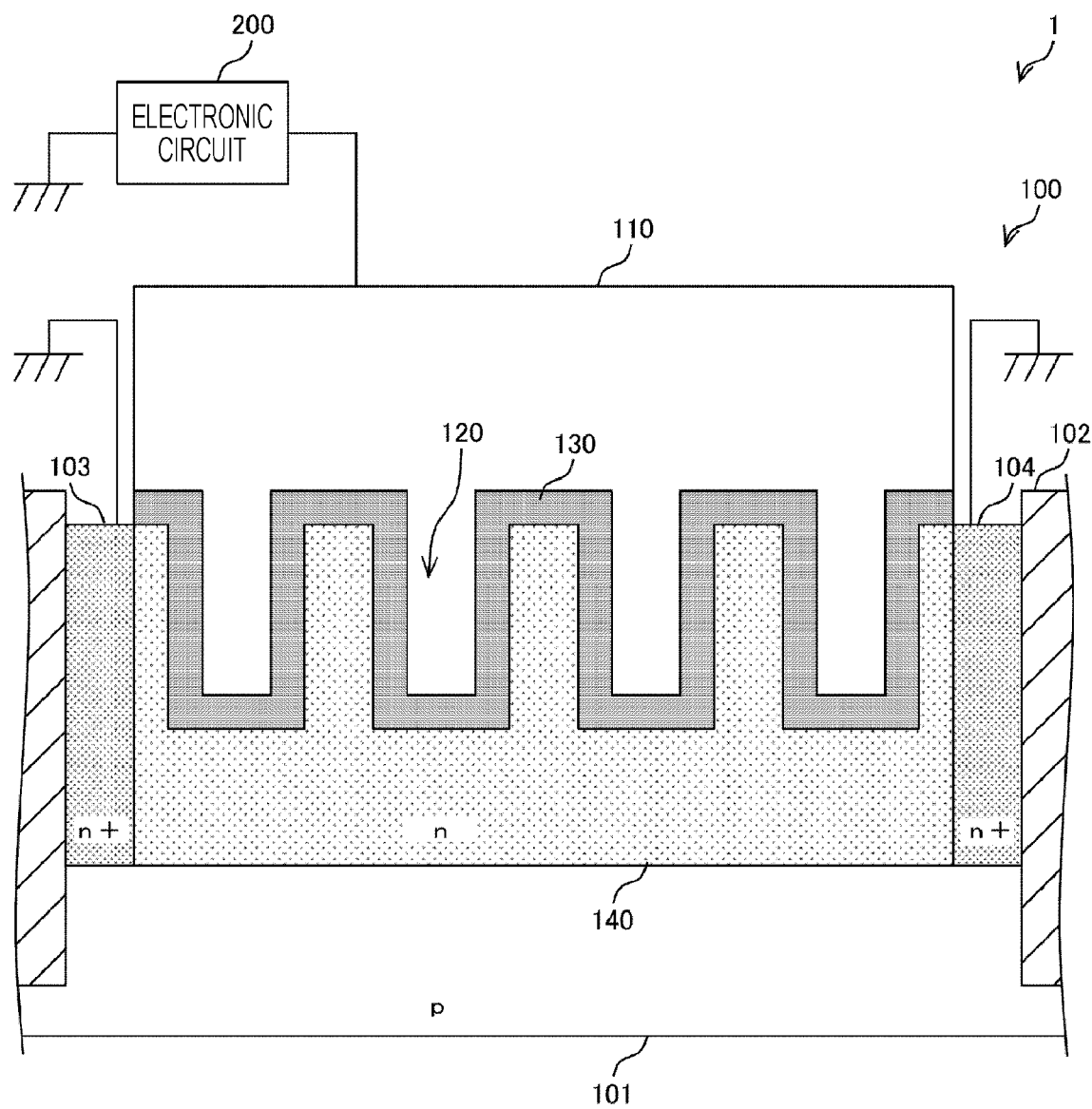
FIG. 2 is a cross-sectional view showing a configuration example of the semiconductor element according to the first embodiment of the present disclosure.

FIG. 2 is a cross-sectional view showing a configuration example of a semiconductor element according to the first embodiment of the present disclosure. The drawing is a cross-sectional view showing a configuration example of the MOS capacitor 100, and is a cross-sectional view taken along the line A-A' in FIG. 1. The MOS capacitor 100 in the drawing includes the semiconductor substrate 101, the separation region 102, the first semiconductor region 140, the insulation film 130, the gate electrode 110, and the second semiconductor regions 103 and 104. Furthermore, in the drawing, an electronic circuit 200 constituting the semiconductor device 1 is shown together with the MOS capacitor 100.

The semiconductor substrate 101 is a semiconductor substrate on which the semiconductor region of the MOS capacitor 100 is formed. The semiconductor substrate 101 can include, for example, silicon (Si). In a well region formed on the semiconductor substrate 101, the first semiconductor region 140, the second semiconductor regions 103 and 104, and the like are formed. For the sake of convenience, it is assumed that the semiconductor substrate 101 in the drawing is formed in a p-type well region. The semiconductor substrate 101 in the drawing can be grounded. Specifically, the semiconductor substrate 101 can be connected to a ground wire via a well contact for connection from the surface of the semiconductor substrate 101 to the well region.

The separation region 102 separates the region of the MOS capacitor 100 in the semiconductor substrate 101. By arranging the separation region 102, the MOS capacitor 100 can be electrically separated from another semiconductor element formed on the semiconductor substrate 101. The separation region 102 in the drawing is assumed to be a separation region 102 formed by shallow trench isolation (STI). That is, the separation region 102 can include silicon oxide ($SiO_2$) embedded in a trench formed in the semiconductor substrate 101. Note that the separation region 102 can be formed by, for example, local oxidation of silicon (LOCOS).

The first semiconductor region 140 is arranged on the semiconductor substrate 101, thus constituting an electrode of the MOS capacitor 100. The first semiconductor region 140 in the drawing includes, for example, an n-type semiconductor region. Furthermore, the recess 120 described in FIG. 1 is arranged in the first semiconductor region 140 in the drawing. As the recess 120, a groove (trench) that has an opening having a substantially rectangular shape formed in the first semiconductor region 140 can be used. Furthermore, one or a plurality of the recesses 120 may be arranged in the first semiconductor region 140. Furthermore, the drawing represents an example of the recess 120 formed to have a substantially rectangular cross section.

The insulation film 130 is a film of an insulation material that constitutes a dielectric layer of the MOS capacitor 100. The insulation film 130 is arranged adjacent to the first semiconductor region 140. The insulation film 130 can include, for example, an oxide such as $SiO_2$ or a nitride such as silicon nitride (SiN).

The gate electrode 110 is an electrode arranged adjacent to the insulation film 130. The gate electrode 110 is arranged so as to face the first semiconductor region 140 via the insulation film 130, thus constituting the MOS capacitor.

Furthermore, as shown in the drawing, the gate electrode 110 is formed in a shape that fills the recess 120 remaining on the surface of the insulation film 130. The gate electrode 110 can include, for example, polycrystalline silicon doped with a donor (P, As, and the like) or an acceptor (B, and the like).

As shown in the drawing, the insulation film 130 is formed to have a thickness smaller than ½ the width of the recess 120 of the first semiconductor region 140. Therefore, even after the insulation film 130 is arranged so as to cover the surface of the recess 120 of the first semiconductor region 140, the insulation film 130 can still have a shape in which the recess remains on its surface. Furthermore, the shape of the recess 120 can be defined on the basis of the thickness of the gate electrode 110. Specifically, the recess 120 can be formed to have a width smaller than approximately twice the thickness of the gate electrode 110. This is to make the surface of the gate electrode 110 flatter. Note that, as described above, in a case where the recess 120 is formed into an opening having a rectangular shape, the short side of the recess 120 can be formed to have a length smaller than approximately twice the thickness of the gate electrode 110.

By forming the recess 120 in the first semiconductor region 140 and embedding the insulation film 130 in the recess 120 in this way, the surface area of the capacitor by the first semiconductor region 140 and the gate electrode 110 can be increased. Therefore, the capacitance of the MOS capacitor 100 can be increased. The capacity per unit area of the MOS capacitor 100 can be increased.

Note that the shape of the recess 120 is not limited to this example. For example, a recess 120 formed in an opening having an elliptical shape can also be used. Furthermore, it is also possible to use a recess 120 having a rectangular shape having chamfered corners or rounded corners. It goes without saying that, even in a case where the corners of the rectangular shape and the like are deformed when the recess 120 is formed, such recess still correspond to the recess 120 of the present disclosure.

The second semiconductor regions 103 and 104 are diffusion regions of the semiconductor substrate 101 arranged adjacent to the first semiconductor region 140. The second semiconductor regions 103 and 104 supply carriers to the first semiconductor region 140 when the MOS capacitor 100 is charged and discharged. That is, it can be regarded as a wiring connected to the first semiconductor region 140. Furthermore, the second semiconductor regions 103 and 104 can be formed in the same conductive type as the first semiconductor region 140. Therefore, the resistance at the connection with the first semiconductor region 140 can be reduced. The MOS capacitor 100 in the drawing is formed in the n-type, which is the same type as that of the first semiconductor region 140. Furthermore, by forming into the shape in which the first semiconductor region 140 is sandwiched between the second semiconductor regions 103 and 104, the current of the first semiconductor region 140 can be shunted and the resistance can be reduced. Furthermore, since the configuration of the MOS capacitor 100 can be the same as that of the MOS transistor formed on the semiconductor substrate 101, the MOS capacitor 100 can be formed by common manufacturing processes.

Note that the configuration of the MOS capacitor 100 is not limited to this example. For example, the first semiconductor region 140 and the second semiconductor regions 103 and 104 formed in a p-type can also be used. Furthermore, it is also possible to apply the semiconductor substrate 100 in an n-type well region, which is the same conductive type as the first semiconductor region 140 and the second semiconductor regions 103 and 104 described above.

The electronic circuit 200 is a circuit that uses the MOS capacitor 100 as a capacitor. In the drawing, one end of the electronic circuit 200 is grounded and the other end is connected to the gate electrode 110. The second semiconductor regions 103 and 104 are similarly grounded to form a circuit in which the MOS capacitor 100 and the electronic circuit 200 are connected in series. Any circuit can be used for the electronic circuit 200.

[Configuration of the Recess]

Figure 3:
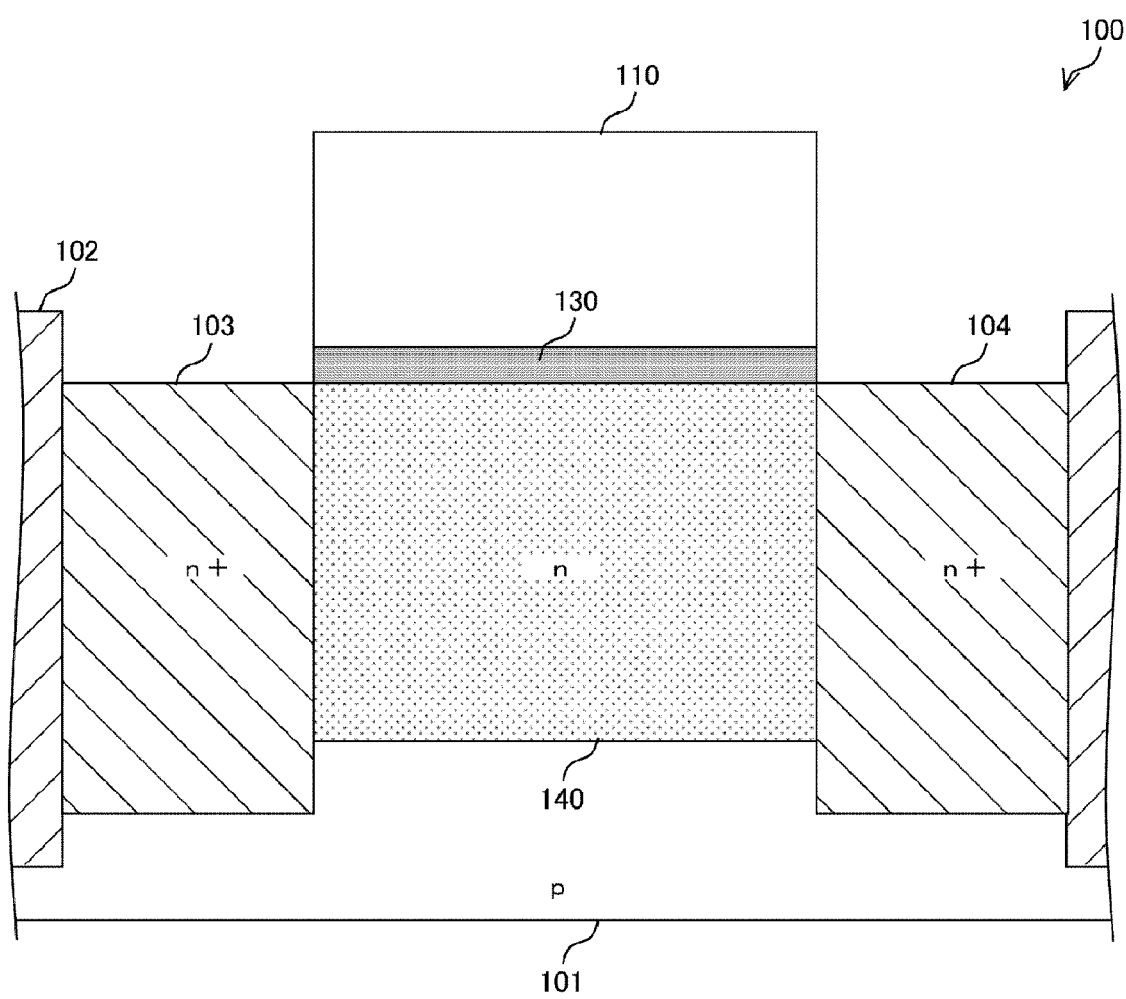
FIG. 3 is a cross-sectional view showing a configuration example of a recess according to the first embodiment of the present disclosure.
Figure 4:
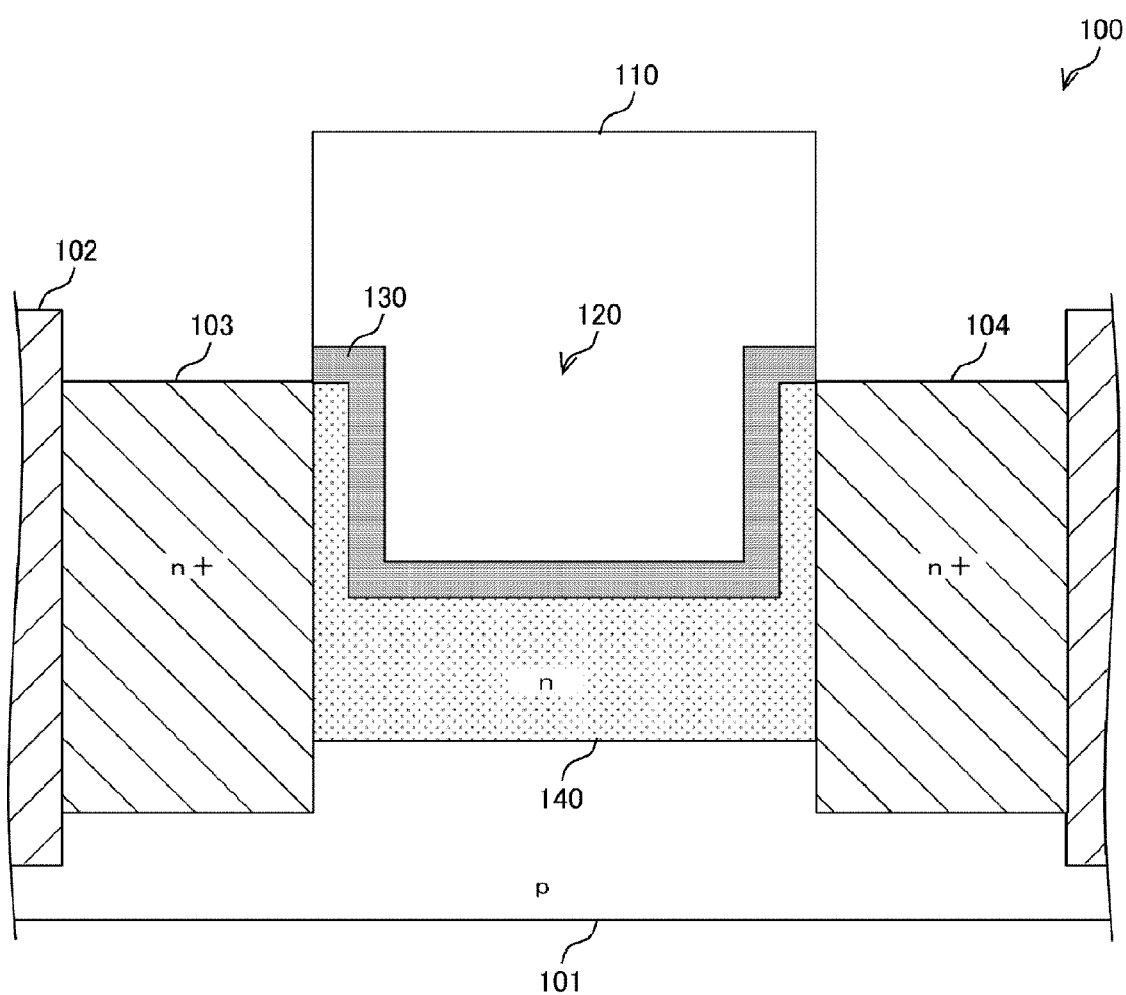
FIG. 4 is a cross-sectional view showing a configuration example of the recess according to the first embodiment of the present disclosure.

FIGS. 3 and 4 are cross-sectional views showing a configuration example of the recess according to the first embodiment of the present disclosure. FIGS. 3 and 4 are cross-sectional views taken along the lines B-B' and C-C' in FIG. 1, respectively. Furthermore, FIG. 4 is a diagram representing a configuration example of the recess 120 in the long side direction. As shown in FIGS. 1 to 4, the recess 120 formed in an opening having a rectangular shape can have a short-side side arranged near the boundary between the first semiconductor region 140 and the second semiconductor regions 103 and 104. That is, the recess 120 can be arranged along the direction from the second semiconductor region 103 to the second semiconductor region 104.

As described above, when the MOS capacitor 100 is charged and discharged, carriers are supplied from the second semiconductor regions 103 and 104 to the first semiconductor region 140. At this time, the supplied carriers are charged and discharged while they move in the lateral direction of the first semiconductor region 140 in the drawing. The carriers move along the long side of the recess 120, so that they can move smoothly. As compared with the case where the short side of the recess 120 is arranged in the direction from the second semiconductor region 103 to the second semiconductor region 104, it is possible to reduce the increase in the effective wiring length due to the arrangement of the recess 120. Wiring resistance and parasitic inductance can be reduced, and the high frequency characteristics of the MOS capacitor 100 can be improved. In a case where a large number of recesses 120 are arranged, a more remarkable effect is obtained.

Note that the configuration of the MOS capacitor 100 is not limited to this example. For example, a sidewall can be arranged adjacent to the gate electrode 110, and a lightly doped drain (LDD) can be formed in the second semiconductor regions 103 and 104. Furthermore, a configuration which any one of the second semiconductor regions 103 and 104 is arranged is also possible. Furthermore, a channel region of another MOS transistor can be applied as the second semiconductor regions 103 and 104.

Furthermore, for example, the recess 120 may be formed in a cylindrical shape. Furthermore, a recess 120 having a tapered (V-shaped) cross section can also be used.

[Characteristics of the MOS Capacitor]

Figure 5:
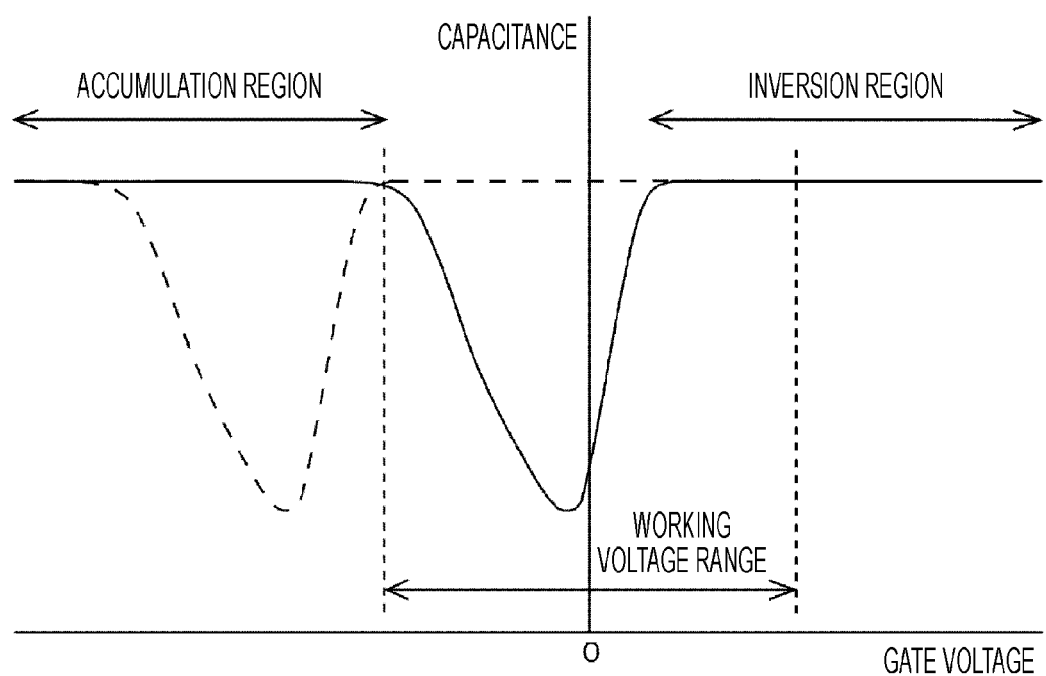
FIG. 5 is a diagram showing an example of characteristics of a MOS capacitor according to the first embodiment of the present disclosure.

FIG. 5 is a diagram showing an example of characteristics of the MOS capacitor according to the first embodiment of the present disclosure. The drawing is a diagram representing the relationship between the applied voltage (gate voltage) and the capacitance of the MOS capacitor 100. The horizontal axis in the drawing represents the gate voltage, and the vertical axis represents the capacitance. Note that the gate voltage is a voltage based on the voltage of the grounded first semiconductor region 140. In a case where a negative gate voltage is applied to the first semiconductor region 140, the capacitance of a value based on the shape, such as the film thickness of the insulation film 130 and the area of the interface between the insulation film 130 and the first semiconductor region 140, and on a dielectric constant is obtained. The region is referred to as an accumulation region. Since the MOS capacitor 100 in the drawing is formed in the p-type well region (semiconductor substrate 101), holes are accumulated when a relatively high negative gate voltage is applied.

On the other hand, in a case where the applied voltage of the gate is increased, the capacitance characteristics depending on the gate voltage are exhibited. Specifically, characteristics, in which the capacitance decreases when the gate voltage changes to a voltage near 0 V, are obtained. This is because a depletion layer is formed in the first semiconductor region 140 near the interface between the first semiconductor region 140 and the insulation film 130, and the effective film thickness of the insulation film 130 increases. Thereafter, when the gate voltage is further increased, the reduced capacitance increases. This is because a surface inversion layer having an increased electron concentration is formed in the first semiconductor region 140 near the interface between the first semiconductor region 140 and the insulation film 130. The surface inversion layer expands as the gate voltage increases, and a capacitance of approximately the same value as the capacitance in the accumulation region is obtained. The region is referred to as an inversion region.

When the MOS capacitor 100 is used for a normal capacitor application, it is preferable to use it at an applied voltage corresponding to the accumulation region and the inversion region in the drawing. This is because the change in circuit characteristics due to changes in capacitance can be reduced. In a case where a working voltage is a voltage near 0 V, for example, in a case where the working voltage range is as low as −3.3 to 3.3 V and the capacitance is to be used in a region that depends on the applied voltage, the characteristics of the MOS capacitor 100 are adjusted. Specifically, the characteristics of the MOS capacitor 100 are adjusted so that the accumulation region or the inversion region and the working voltage range overlap.

In that case, it is preferable that the first semiconductor region 140 should have a higher impurity concentration. Specifically, the first semiconductor region 140 should have an impurity concentration higher than $10^{18}/cm^3$. The solid line in the drawing represents the characteristics in a case where the impurity concentration of the first semiconductor region 140 is low, and the dotted line represents the characteristics in a case where the impurity concentration of the first semiconductor region 140 is high. By increasing the impurity concentration of the first semiconductor region 140, the voltage dependence can be reduced in the working voltage range.

As described above, in the MOS capacitor 100 of the first embodiment of the present disclosure, the recess 120 is arranged in the first semiconductor region 140, thereby, expanding the first semiconductor region 140, which functions as an electrode, and the interface between the gate electrode 110 and the insulation film 130. Therefore, the capacity of the MOS capacitor 100 can be increased.

2. Second Embodiment

In the MOS capacitor 100 of the first embodiment described above, the recess 120 is formed in the first semiconductor region 140. In the second embodiment of the present disclosure, a method for manufacturing the MOS capacitor 100 having such a configuration will be described.

[Method for Manufacturing the Semiconductor Element]

Figure 6:
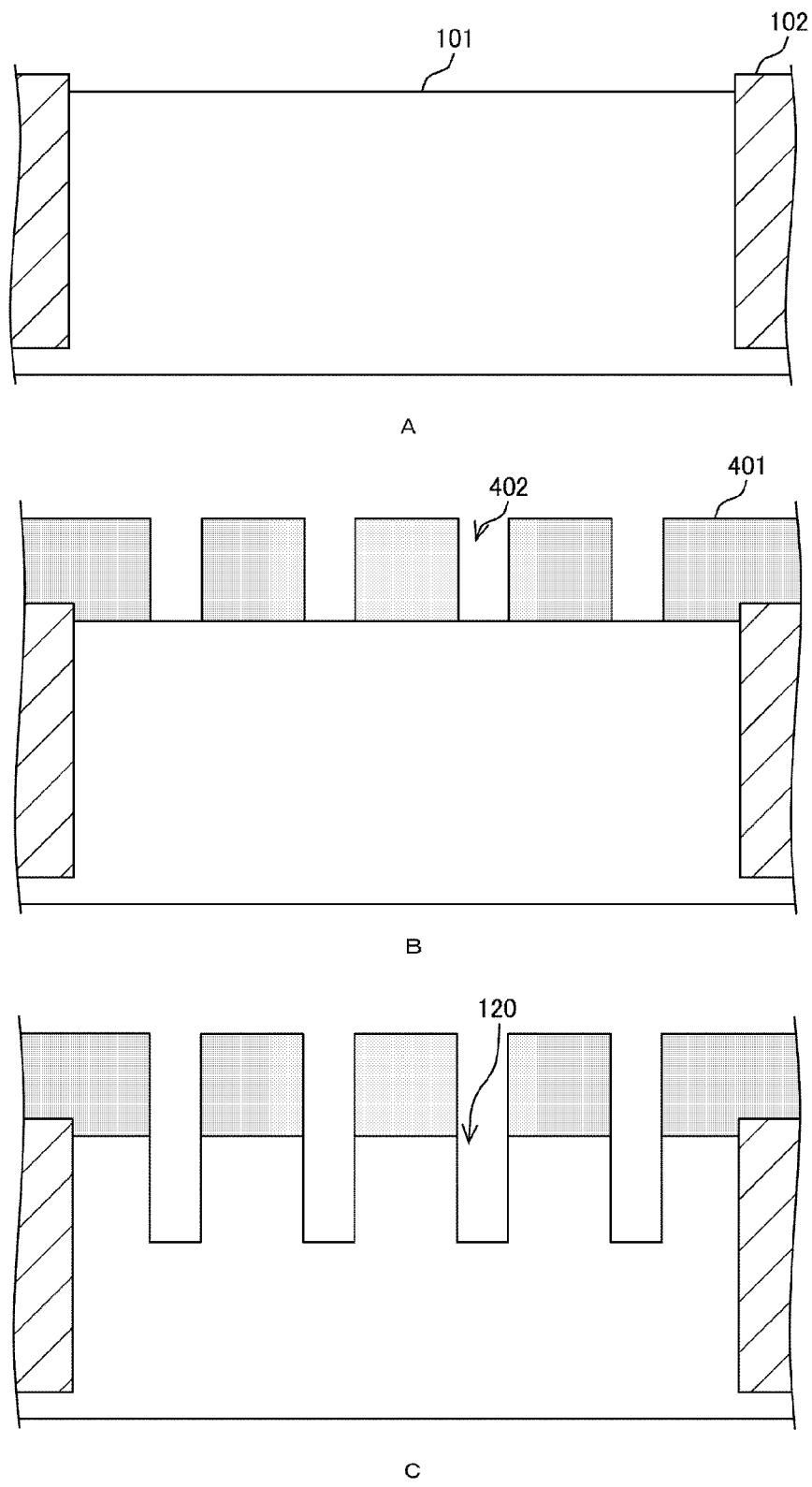
FIG. 6 is a diagram showing an example of a method for manufacturing a semiconductor element according to a second embodiment of the present disclosure.
Figure 7:
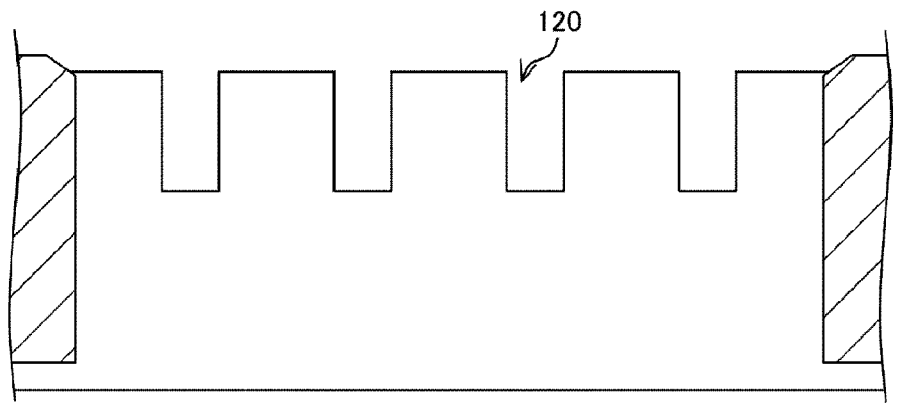
FIG. 7 is a diagram showing an example of the method for manufacturing a semiconductor element according to the second embodiment of the present disclosure.
Figure 7:
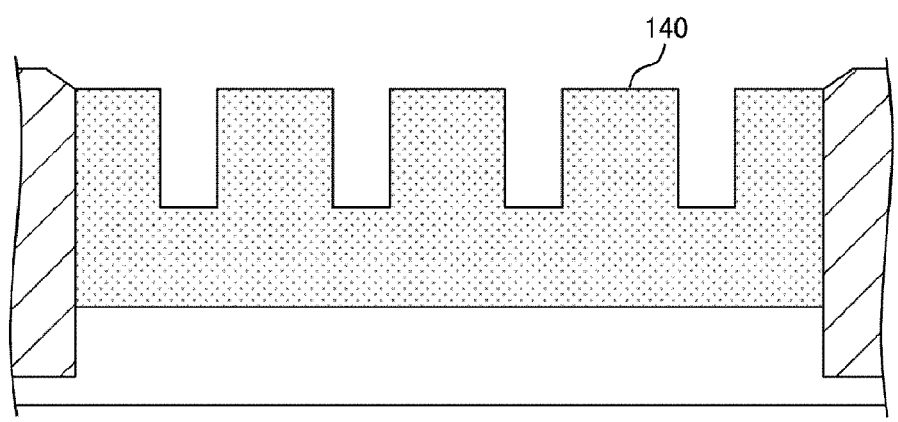
Figure 7:
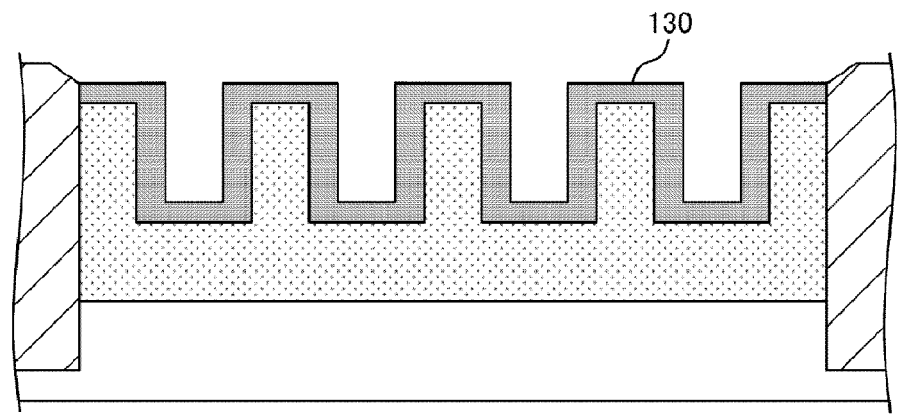
Figure 8:
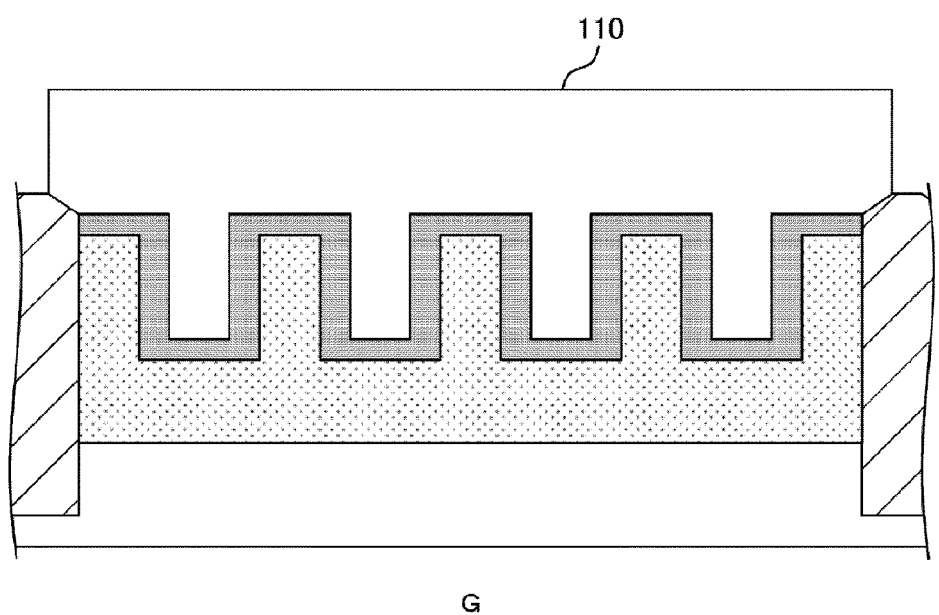
FIG. 8 is a diagram showing an example of the method for manufacturing a semiconductor element according to the second embodiment of the present disclosure.

FIGS. 6 to 8 are diagrams showing an example of a method for manufacturing the semiconductor element according to the second embodiment of the present disclosure. FIGS. 6 to 8 are diagrams showing an example of the manufacturing process of the MOS capacitor 100. The manufacturing process of the recess 120 and the like in the vicinity of the gate electrode 110 will mainly be described with reference to FIGS. 6 to 8.

First, a well region is formed on the semiconductor substrate 101, and the separation region 102 is formed. The separation region 102 can be formed by forming a trench in the semiconductor substrate 101 and arranging an insulation material such as $SiO_2$ in the trench (A in FIG. 6).

Next, a resist 401 is formed on the surface of the semiconductor substrate 101. An opening 402 is arranged in the resist 401 at a position where the recess 120 is formed. The resist 401 can be formed by photolithography (B in FIG. 6). Next, the semiconductor substrate 101 is etched using the resist 401 as a mask. This etching can be performed by dry etching, for example. Therefore, the recess 120 can be formed (C in FIG. 6). Next, the resist 401, the residue during the etching, and the like are removed. This can be done, for example, by wet etching (D in FIG. 7).

Next, ion implantation is performed on the surface of the semiconductor substrate 101 to form the first semiconductor region 140. At this time, the second semiconductor regions 103 and 104 (not shown) are similarly formed by ion implantation. Prior to this ion implantation, a sacrificial oxide film that controls ion permeation can also be formed (E in FIG. 7). Note that the sacrificial oxide film is removed after the ion implantation.

Next, the insulation film 130 is formed on the surface of the first semiconductor region 140. This can be done, for example, by thermal oxidation (F in FIG. 7).

Next, the gate electrode 110 is formed on the surface of the insulation film 130. This can be formed, for example, by chemical vapor deposition (CVD) (G in FIG. 8).

The MOS capacitor 100 can be manufactured by the above processes. Note that, in a case where the first semiconductor region 140 is formed by the ion implantation as described above, it is preferable that the recess 120 have a depth of less than 200 nm. This is to form the first semiconductor region 140 having a uniform impurity concentration.

[Another Method for Manufacturing the Semiconductor Element]

Figure 9:
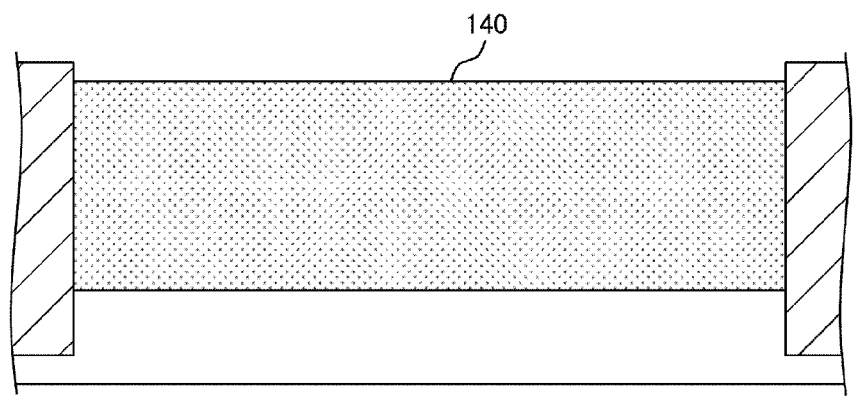
FIG. 9 is a diagram showing another example of the method for manufacturing a semiconductor element according to the second embodiment of the present disclosure.
Figure 9:
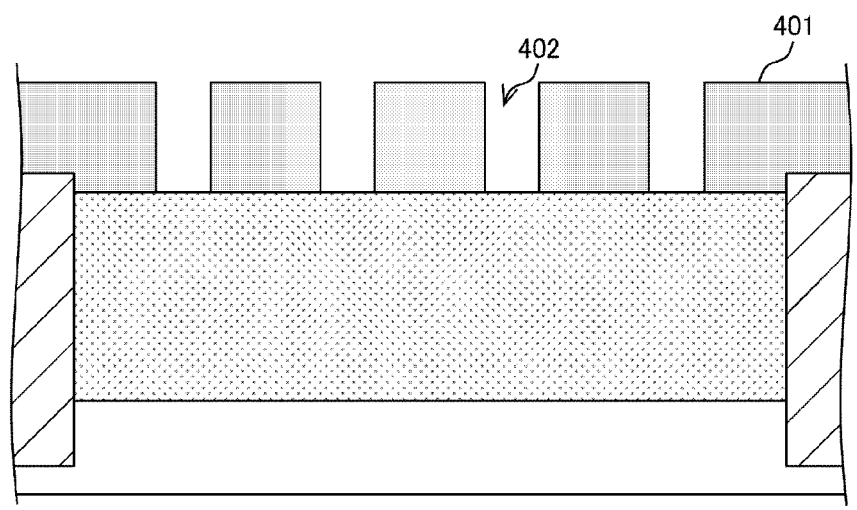
Figure 9:
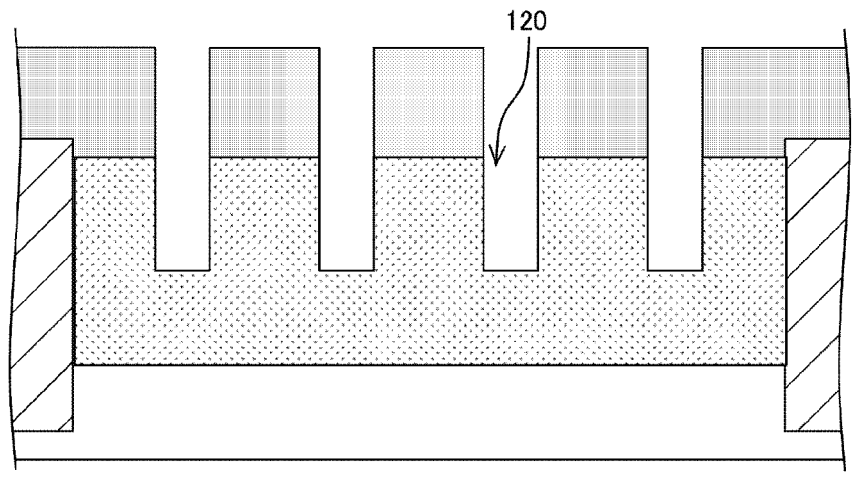

FIG. 9 is a diagram showing another example of a method for manufacturing the semiconductor element according to the second embodiment of the present disclosure. The drawing is a diagram representing the manufacturing processes corresponding to A in FIG. 6 to E in FIG. 7.

The ion implantation is performed on the surface of the semiconductor substrate 101 on which the separation region 102 is formed, thus forming the first semiconductor region 140 (A in FIG. 9). Next, the resist 401 is formed on the surface of the first semiconductor region 140 (B in FIG. 9). Next, etching is performed to form the recess 120 (C in FIG. 9). Thereafter, the resist 401 is removed. Since the subsequent manufacturing processes are similar to F in FIG. 7 and FIG. 8, the description will not be repeated.

Note that the manufacturing processes of the MOS capacitor 100 are not limited to this example. For example, the first semiconductor region 140 can be formed by thermal diffusion instead of ion implantation.

As described above, in the second embodiment of the present disclosure, the MOS capacitor 100 having the first semiconductor region 140 in which the recess 120 is formed can be manufactured.

<3. Examples of Application to the Imaging Element>

The technology according to the present disclosure (present technology) is applicable to a variety of products. For example, the present technology may be embodied as a semiconductor element mounted on a semiconductor device such as an imaging element.

[Configuration of the Imaging Element]

Figure 10:
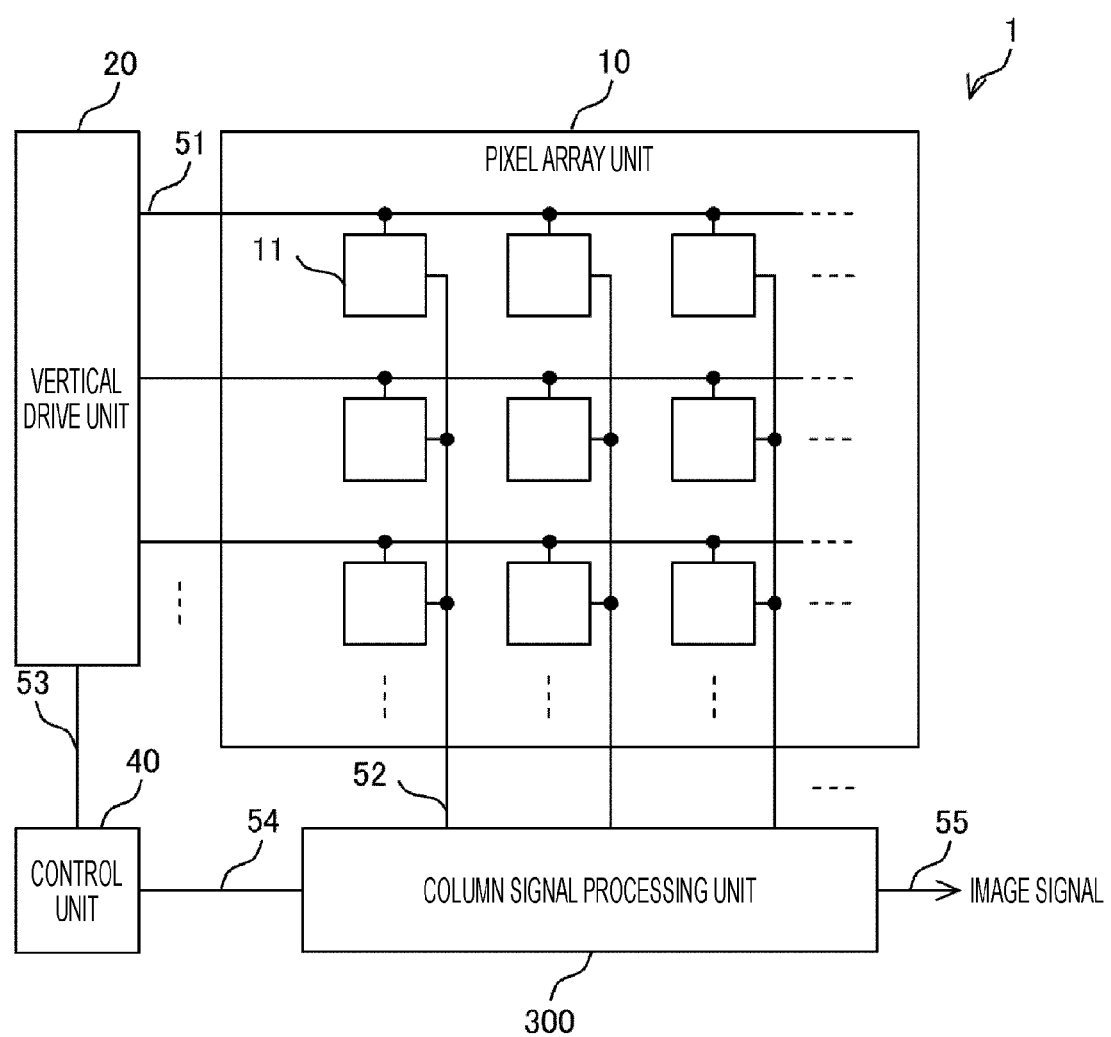
FIG. 10 is a block diagram showing a configuration example of an imaging element, which is an example of a semiconductor device to which the present disclosure can be applied.

FIG. 10 is a block diagram showing a configuration example of the imaging element, which is an example of a semiconductor device to which the present disclosure can be applied. An imaging element 1 in the drawing includes a pixel array unit 10, a vertical drive unit 20, a column signal processing unit 300, and a control unit 40.

The pixel array unit 10 is configured by arranging pixels 11 in a two-dimensional grid pattern. Here, the pixel 11 generates an image signal depending on irradiation light. The pixel 11 has a photoelectric conversion unit that generates charges depending on the irradiation light. Further, the pixel 11 further has a pixel circuit. This pixel circuit generates an image signal based on the charges generated by the photoelectric conversion unit. Generation of the image signal is controlled by a control signal generated by the vertical drive unit 20 described later. In the pixel array unit 10, signal lines 51 and 52 are arranged in an XY matrix pattern. The signal line 51 is a signal line that transmits a control signal for the pixel circuit in the pixel 11, is arranged for each row of the pixel array unit 10, and is commonly wired to the pixels 11 arranged in each row. The signal line 52 is a signal line that transmits an image signal generated by the pixel circuit of the pixel 11, is arranged for each column of the pixel array unit 10, and is commonly wired to the pixels 11 arranged in each column. These photoelectric conversion units and pixel circuits are formed on a semiconductor substrate. For example, they can be formed on the above-mentioned semiconductor substrate 101.

The vertical drive unit 20 generates a control signal for the pixel circuit of the pixel 11. The vertical drive unit 20 transmits the generated control signal to the pixel 11 via the signal line 51 in the drawing. The column signal processing unit 300 processes the image signal generated by the pixel 11. The column signal processing unit 300 processes the image signal transmitted from the pixel 11 via the signal line 52 in the drawing. The processing in the column signal processing unit 300 corresponds to, for example, analog-to-digital conversion that converts an analog image signal generated in the pixel 11 into a digital image signal. The image signal processed by the column signal processing unit 300 is output as an image signal of the imaging element 1. The control unit 40 controls the entire imaging element 1. The control unit 40 controls the imaging element 1 by generating and outputting a control signal for controlling the vertical drive unit 20 and the column signal processing unit 300. The control signal generated by the control unit 40 is transmitted to the vertical drive unit 20 and the column signal processing unit 300 by signal lines 53 and 54, respectively.

[Configuration of the Column Signal Processing Unit]

Figure 11:
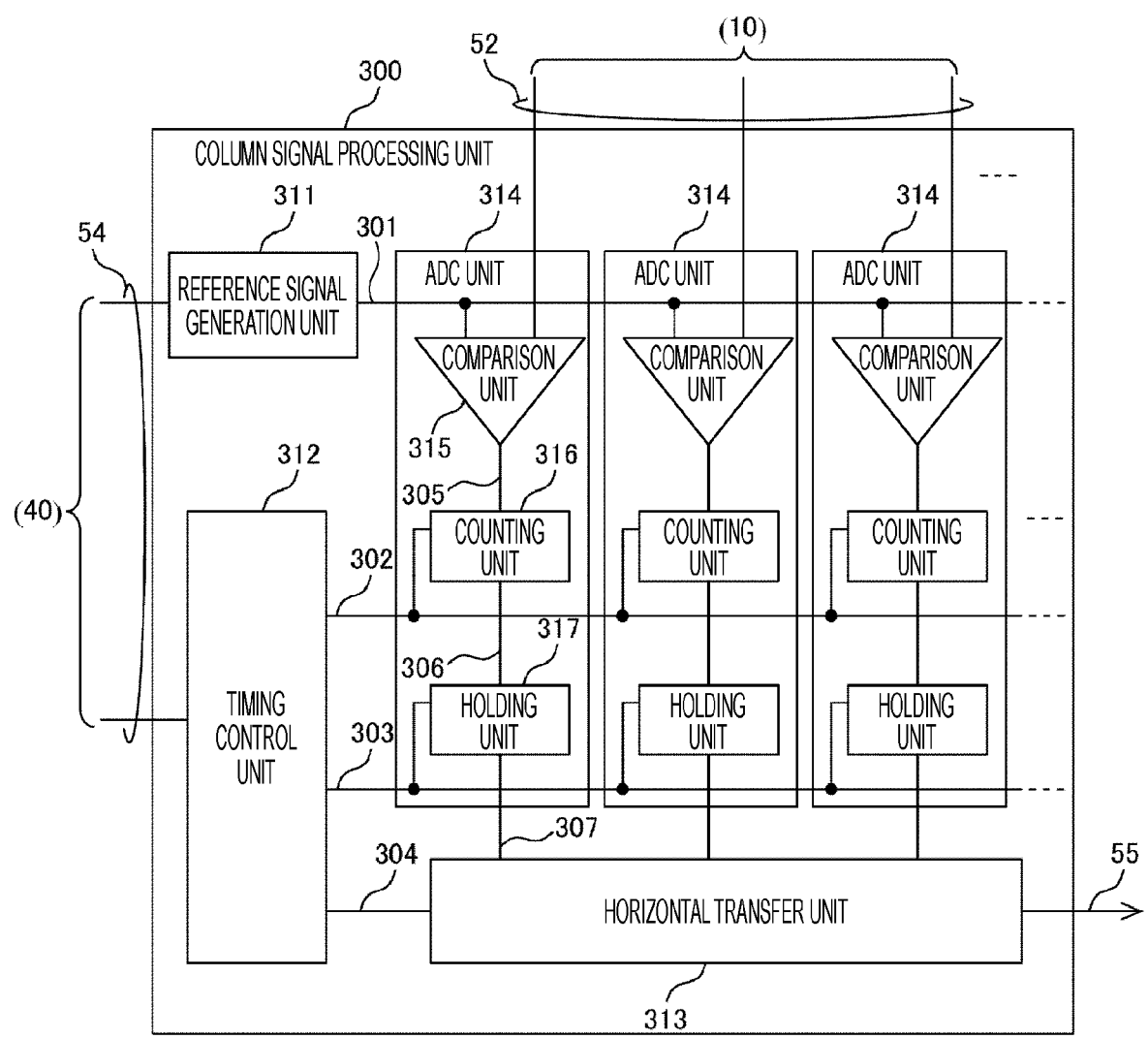
FIG. 11 is a block diagram showing a configuration example of a column signal processing unit of an imaging element to which the present disclosure can be applied.

FIG. 11 is a block diagram showing a configuration example of a column signal processing unit of an imaging element to which the present disclosure can be applied. The column signal processing unit 300 in the drawing includes a reference signal generation unit 311, a timing control unit 312, a horizontal transfer unit 313, and an analog-to-digital conversion (ADC) unit 314.

The reference signal generation unit 311 generates a reference signal. Here, the reference signal is a signal that serves as a reference for analog-to-digital conversion in the analog-to-digital conversion unit 314, which will be described later. As the reference signal, for example, a signal whose voltage drops like a ramp function can be used. The reference signal generation unit 311 generates a reference signal according to the control of the control unit 40, and supplies the reference signal to the analog-to-digital conversion unit 314 via a signal line 301.

The timing control unit 312 controls the operation timing of each component in the column signal processing unit 300. The timing control unit 312 generates a control signal for each component of the column signal processing unit 300 according to the control of the control unit 40, and outputs the control signal via signal lines 302 to 304.

The analog-to-digital conversion unit 314 converts an analog image signal generated by the pixel 11 into a digital image signal. The analog-to-digital conversion unit 314 is arranged for each signal line 52. The plurality of analog-to-digital conversion units 314 simultaneously performs analog-to-digital conversion of the image signals in the pixels 11 in one row of the pixel array unit 10. The digital image signal converted by the analog-to-digital conversion unit 314 is output to the horizontal transfer unit 313 via a signal line 307.

The horizontal transfer unit 313 transfers the digital image signal. The horizontal transfer unit 313 sequentially transfers the digital image signals generated by the plurality of analog-to-digital conversion units 314 and outputs the signals from a signal line 55.

The analog-to-digital conversion unit 314 in the drawing includes a comparison unit 315, a counting unit 316, and a holding unit 317.

The comparison unit 315 compares the analog image signal generated by the pixel 11 with the reference signal, and outputs a comparison result to the counting unit 316. For example, as a result of the comparison, a value "0" can be output in a case where the reference signal has a voltage higher than the analog image signal, and a value "1" can be output in a case where the reference signal has shifted to a voltage lower than the analog image signal. Therefore, it is possible to detect the timing at which the reference signal has substantially the same value as the analog image signal.

The counting unit 316 measures the time from the start of the comparison in the comparison unit 315 until the reference signal and the analog image signal have substantially the same value. Specifically, the time from the start of the output of the reference signal in the reference signal generation unit 311 to the transition of the output of the comparison unit 315 to the value "1" is measured. As described above, the reference signal is a signal whose value changes like a ramp function. Therefore, there is a one-to-one correspondence between the time until the reference signal has substantially the same value as the analog image signal and the voltage of the analog image signal. Therefore, the analog-to-digital conversion can be performed by generating and outputting a digital signal corresponding to the elapsed time until when the reference signal has substantially the same value as the analog image signal. Specifically, the counting unit 316 can count a clock signal during the period from the start of the output of the reference signal to the transition of the output of the comparison unit 315 to the value "1", and output the count value as a result of the analog-to-digital conversion. Note that the clock signal is input from the timing control unit 312 via the signal line 302.

The holding unit 317 holds the count value of the counting unit 316. Each count value held by each of the plurality of holding units 317 is sequentially output to the horizontal transfer unit 313 as a digital image signal on the basis of the control of the timing control unit 312.

[Configuration of the Comparison Unit]

Figure 12:
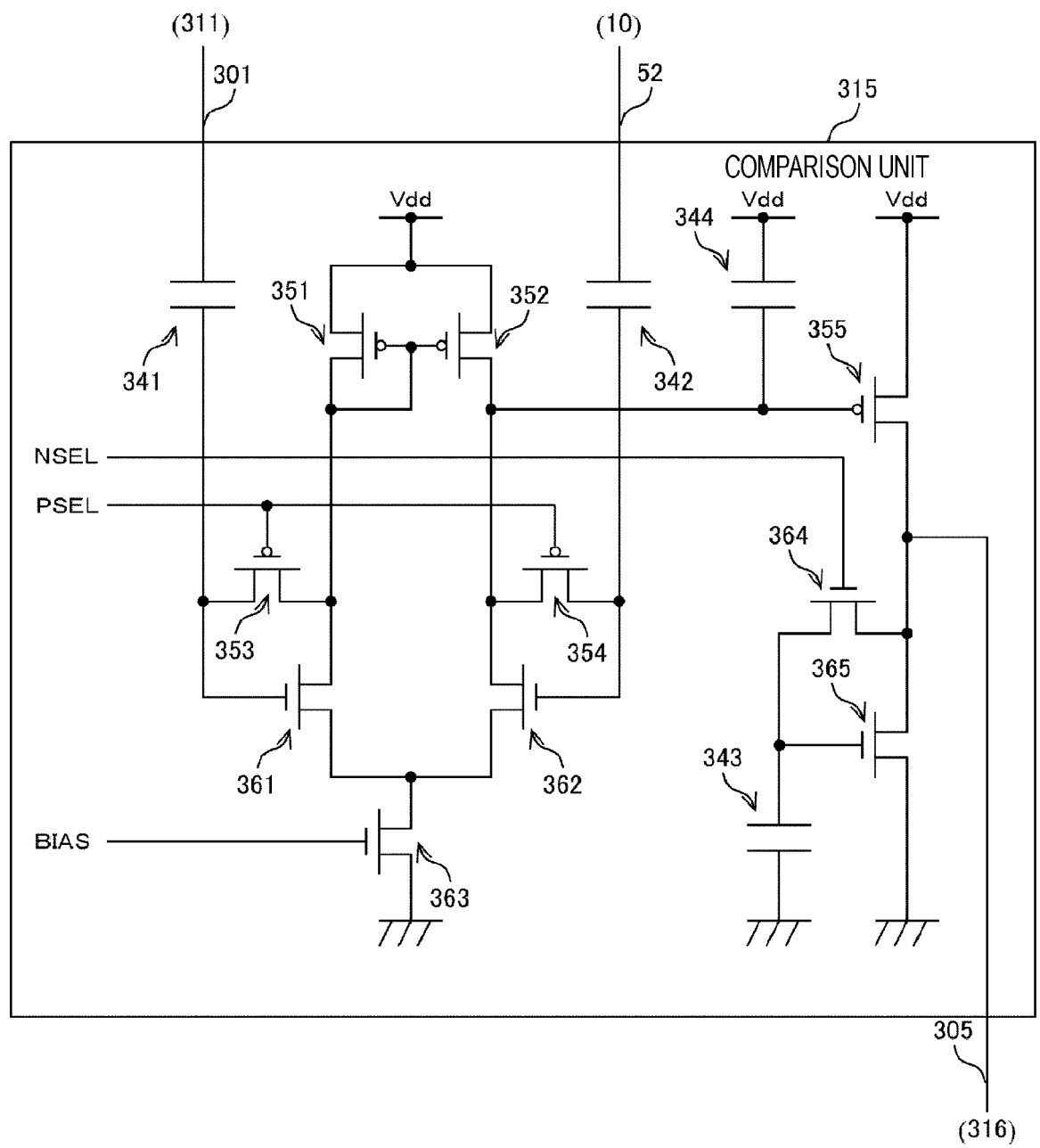
FIG. 12 is a circuit diagram showing a configuration example of a comparison unit of an imaging element to which the present disclosure can be applied.

FIG. 12 is a circuit diagram showing a configuration example of the comparison unit of an imaging element to which the present disclosure can be applied. The comparison unit 315 in the drawing includes capacitors 341 to 344, MOS transistors 351 to 355, and MOS transistors 361 to 365. As the MOS transistors 351 to 355, a p-channel MOS transistor can be used. Furthermore, as the MOS transistors 361 to 365, an n-channel MOS transistor can be used. Furthermore, a power supply line Vdd for supplying power, a signal line BIAS for supplying a bias voltage, and signal lines NSEL and PSEL for supplying a selection signal are wired to the comparison unit 315 in the drawing.

The capacitor 341 is connected between the signal line 301 and the gate of the MOS transistor 361. The drain of the MOS transistor 353 is further connected to the gate of the MOS transistor 361. The drain of the MOS transistor 361 is connected to the source of the MOS transistor 353, the drain and gate of the MOS transistor 351, and the gate of the MOS transistor 352. The source of the MOS transistor 351 and the source of the MOS transistor 352 are commonly connected to the power supply line Vdd. The source of the MOS transistor 361 is connected to the source of the MOS transistor 362 and the drain of the MOS transistor 363. The gate of the MOS transistor 363 is connected to the signal line BIAS, and the source is grounded.

The capacitor 342 is connected between the signal line 52 and the gate of the MOS transistor 362. The drain of the MOS transistor 354 is further connected to the gate of the MOS transistor 362. The drain of the MOS transistor 362 is connected to the source of the MOS transistor 354, the drain of the MOS transistor 352, the gate of the MOS transistor 355, and one end of the capacitor 344. The other end of the capacitor 344 is connected to the power supply line Vdd. The gate of the MOS transistor 353 and the gate of the MOS transistor 354 are commonly connected to the signal line PSEL. The source of the MOS transistor 355 is connected to the power supply line Vdd, the drain is connected to the drain of the MOS transistor 364, the drain of the MOS transistor 365, and the signal line 305.

The gate of the MOS transistor 364 is connected to the signal line NSEL, and the source is connected to the gate of the MOS transistor 365 and one end of the capacitor 343. The other end of capacitor 343 and the source of MOS transistor 365 are grounded.

The capacitors 341 and 342 constitute a coupling capacitor. Furthermore, the capacitors 341 and 342 hold a reference signal and an analog image signal, respectively. The MOS transistors 361 and 362 constitute a differential amplifier and amplify the difference between the reference signal and the analog image signal input via the capacitors 341 and 342. The MOS transistor 363 constitutes a constant current circuit commonly connected to the sources of the MOS transistors 361 and 362. A source current based on the bias voltage of the signal line BIAS flows through the MOS transistor 363. The MOS transistors 351 and 352 constitute a current mirror circuit and constitute loads connected to the drains of the MOS transistors 361 and 362, respectively.

This current mirror circuit can improve the gain of the differential amplifier including the MOS transistors 361 and 362.

By amplifying the difference between the reference signal and the analog image signal using a high gain differential amplifier, the reference signal and the analog image signal can be compared. Note that the MOS transistors 353 and 354 are switches that control amplification (comparison) by the MOS transistors 361 and 362. The MOS transistors 353 and 354 perform control on the basis of the selection signal of the signal line PSEL.

The output of the differential amplifier is taken from the drain of the MOS transistor 362 and input to the gate of the MOS transistor 355. The MOS transistor 355 further amplifies the output of the differential amplifier, reverses the polarity of the signal, and outputs the signal to the signal line 305. The MOS transistor 365 is a transistor that holds the output of the MOS transistor 355. The output of the MOS transistor 355 is held by the capacitor 343 via the MOS transistor 364. Since the gate of the MOS transistor 365 is connected to the capacitor 343, the MOS transistor 365 outputs a drain voltage corresponding to the voltage of the capacitor 343. The MOS transistor 364 is a switch that controls the holding of the output of the MOS transistor 355 in the capacitor 343, and is controlled by the selection signal of the signal line NSEL.

Furthermore, the capacitor 344 is connected between the gate of the MOS transistor 355 and the power supply line Vdd. This capacitor 344 is a band limiting capacity for reducing the output noise of the differential amplifier including the MOS transistors 361 and 362. As described above, the reference signal and the analog image signal are compared in the differential amplifier including the MOS transistors 361 and 362. However, in a case where the gain in the high frequency range of the differential amplifier is too high, noise components such as analog image signals are also amplified, which causes a malfunction of the analog-to-digital conversion unit 314. By connecting the capacitor 344, which is the above-mentioned band limiting capacity, the band of the differential amplifier including the MOS transistors 361 and 362 can be narrowed to reduce the gain in the high frequency range, and the output noise can be reduced.

The MOS capacitor 100 of the present disclosure can be applied to the capacitors 341 to 344 of the comparison unit 315 in the drawing. For example, the MOS capacitor 100 can be applied to the capacitor 344, and the MOS capacitor 100 can be charged and discharged by the differential amplifier including the MOS transistors 361 and 362. By applying the MOS capacitor 100 of the present disclosure, which is capable of increasing the capacity, to the capacitors 341 to 344, the area occupied by the capacitors 341 to 344 can be reduced. Sizes of the analog-to-digital conversion unit 314 and the imaging element 1 can be reduced. Note that the differential amplifier including the MOS transistors 361 and 362 is an example of the electronic circuit described in the claims. The analog-to-digital conversion unit 314 and the imaging element 1 are examples of the semiconductor device described in the claims.

Finally, the description of each embodiment described above is an example of the present disclosure, and the present disclosure is not limited to the above-described embodiments. Therefore, it goes without saying that various changes, even those different from the above-described embodiments, can be made according to the design and the like without departing from the technical concept according to the present disclosure.

Note that the present technology may be configured as below.

(1) A semiconductor element including:
a first semiconductor region that is arranged on a semiconductor substrate and includes a recess on a surface;
an insulation film that is arranged adjacent to the surface of the first semiconductor region;
a gate electrode that is arranged adjacent to the insulation film and between which and the first semiconductor region, a MOS capacitor is constituted; and
a second semiconductor region that is arranged adjacent to the first semiconductor region on the semiconductor substrate, formed in a same conductive type as the first semiconductor region, and supplies a carrier to the first semiconductor region when the MOS capacitor is charged and discharged.

(2) The semiconductor element according to (1), in which the first semiconductor region includes a plurality of the recesses.

(3) The semiconductor element according to (1) or (2), in which the first semiconductor region includes the recess formed in an opening having a substantially rectangular shape.

(4) The semiconductor element according to (3), in which the first semiconductor region has a short side of the rectangle arranged near a boundary with the second semiconductor region.

(5) The semiconductor element according to (3), in which the first semiconductor region includes the recess formed to have a short side having a length smaller than approximately twice a thickness of the gate electrode.

(6) The semiconductor element according to any of (1) to (5), in which the first semiconductor region has an impurity concentration higher than $10^{18}/cm^3$.

(7) A semiconductor device including:
a first semiconductor region that is arranged on a semiconductor substrate and includes a recess on a surface;
an insulation film that is arranged adjacent to the surface of the first semiconductor region;
a gate electrode that is arranged adjacent to the insulation film and between which and the first semiconductor region, a MOS capacitor is constituted;
a second semiconductor region that is arranged adjacent to the first semiconductor region on the semiconductor substrate, formed in a same conductive type as the first semiconductor region, and supplies a carrier to the first semiconductor region when the MOS capacitor is charged and discharged; and
an electronic circuit that supplies current for the MOS capacitor to be charged and discharged via the gate electrode and the second semiconductor region.

REFERENCE SIGNS LIST

1 Imaging element
100 MOS capacitor
101 Semiconductor substrate
102 Separation region
103, 104 Second semiconductor region
110 Gate electrode
120 Recess
130 Insulation film
140 First semiconductor region
200 Electronic circuit
300 Column signal processing unit
314 Analog-to-digital conversion unit
315 Comparison unit
341 to 344 Capacitor
351 to 355,361 to 365 MOS transistor

What is claimed is:

1. A semiconductor element comprising:
a first semiconductor region that is arranged on a semiconductor substrate and includes a recess on a surface;
an insulation film that is arranged adjacent to the surface of the first semiconductor region;
a gate electrode that is arranged adjacent to the insulation film and between which and the first semiconductor region, a MOS capacitor is constituted; and
a second semiconductor region that is arranged adjacent to a left side and a right side of the first semiconductor region on the semiconductor substrate in a cross-sectional view, formed in a same conductive type as the first semiconductor region, and supplies a carrier to the first semiconductor region when the MOS capacitor is charged and discharged, wherein the second semiconductor region extends equally in a depth direction as the first semiconductor region.

2. The semiconductor element according to claim 1, wherein the first semiconductor region includes a plurality of recesses.

3. The semiconductor element according to claim 1, wherein the first semiconductor region includes the recess formed in an opening having a substantially rectangular shape.

4. The semiconductor element according to claim 3, wherein the first semiconductor region has a short side of a rectangle arranged near a boundary with the second semiconductor region.

5. The semiconductor element according to claim 3, wherein the first semiconductor region includes the recess formed to have a short side having a length smaller than approximately twice a thickness of the gate electrode.

6. The semiconductor element according to claim 1, wherein the first semiconductor region has an impurity concentration higher than $10^{18}/cm^3$.

7. A semiconductor device comprising:
a first semiconductor region that is arranged on a semiconductor substrate and includes a recess on a surface;
an insulation film that is arranged adjacent to the surface of the first semiconductor region;
a gate electrode that is arranged adjacent to the insulation film and between which and the first semiconductor region, a MOS capacitor is constituted;
a second semiconductor region that is arranged adjacent to a left side and a right side of the first semiconductor region on the semiconductor substrate in a cross-sectional view, formed in a same conductive type as the first semiconductor region, and supplies a carrier to the first semiconductor region when the MOS capacitor is charged and discharged, wherein the second semiconductor region extends equally in a depth direction as the first semiconductor region; and
an electronic circuit that supplies current for the MOS capacitor to be charged and discharged via the gate electrode and the second semiconductor region.

* * * * *